United States Patent
Iwasaki (10) Patent No.: US 12,408,313 B2
(45) Date of Patent: Sep. 2, 2025

(54) SYSTEM FOR PREPARING COMPONENT FEED UNIT

(71) Applicant: FUJI CORPORATION, Chiryu (JP)

(72) Inventor: Masataka Iwasaki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 471 days.

(21) Appl. No.: 17/791,420

(22) PCT Filed: Jan. 14, 2020

(86) PCT No.: PCT/JP2020/000931
§ 371 (c)(1),
(2) Date: Jul. 7, 2022

(87) PCT Pub. No.: WO2021/144864
PCT Pub. Date: Jul. 22, 2021

(65) Prior Publication Data
US 2023/0035634 A1  Feb. 2, 2023

(51) Int. Cl.
*H05K 13/08* (2006.01)
*H05K 13/02* (2006.01)

(52) U.S. Cl.
CPC ......... *H05K 13/086* (2018.08); *H05K 13/021* (2013.01); *Y10T 29/53178* (2015.01)

(58) Field of Classification Search
CPC .... H05K 13/086; H05K 13/02; H05K 13/021; Y10T 29/53187; Y10T 29/53417; Y10T 29/53178
USPC .................................. 29/740, 739, 742, 832
See application file for complete search history.

(56) References Cited

U.S. PATENT DOCUMENTS

| | | | |
|---|---|---|---|
| 5,503,516 A * | 4/1996 | Kasai | B23P 19/001 414/800 |
| 10,820,459 B2 * | 10/2020 | Kondo | H05K 13/08 |
| 2018/0220560 A1 | 8/2018 | Otsuka et al. | |

FOREIGN PATENT DOCUMENTS

| | | |
|---|---|---|
| DE | 20 2016 103 393 U1 | 11/2017 |
| JP | 2011-3801 A | 1/2011 |
| JP | WO 2014/010083 A1 | 1/2014 |
| JP | 2014-197594 A | 10/2014 |
| JP | 2018-125383 A | 8/2018 |

(Continued)

OTHER PUBLICATIONS

International Search Report issued Mar. 24, 2020 in PCT/JP2020/000931, filed on Jan. 14, 2020, 3 pages.

*Primary Examiner* — Thiem D Phan
(74) *Attorney, Agent, or Firm* — Oblon, McClelland, Maier &Neustadt, L.L.P.

(57) ABSTRACT

A component supply unit set-up system includes a container warehouse configured to store multiple component containers for containing multiple components, a unit storage shed configured to store multiple component supply units used when the component, which is contained in the component container, is supplied in a mounting operation performed by a component mounter, a work table disposed between the container warehouse and the unit storage shed and used for a loading operation of loading the component supply unit with the component container, a container conveyance robot configured to convey the component container between the container warehouse and the work table, and a unit conveyance robot configured to convey the component supply unit between the unit storage shed and the work table.

8 Claims, 7 Drawing Sheets

(56) References Cited

FOREIGN PATENT DOCUMENTS

| JP | WO 2018/173204 A1 | 9/2018 |
|----|-------------------|--------|
| JP | 2019-91771 A | 6/2019 |
| JP | WO 2019/142336 A1 | 7/2019 |

\* cited by examiner

SYSTEM FOR PREPARING COMPONENT FEED UNIT

TECHNICAL FIELD

The present specification relates to a set-up system corresponding to a loading operation for loading a component supply unit with a component container and related operations before and after the loading operation.

BACKGROUND ART

A technique of mass-producing board products by performing board work on a board on which printed wiring is performed has become widespread. Further, it is common to provide multiple types of board work machines for performing the board work side by side so as to configure a board work line. A component mounter among the board work machines uses a component supply unit loaded with the component container that contains multiple components. The loading operation for loading the component supply unit with the component container, in other words, a set-up operation for preparing the component supply unit for use, is often performed in a set-up area distant from the component mounter being operated (external set-up).

This loading operation has been conventionally performed by human hand and requires a lot of labor. Further, the loading operation is performed ahead of schedule to ensure that the production plan is achieved, which increases the number of work-in-process component supply units that cannot be diverted to other uses. Therefore, the management is complicated and further labor is required. In recent years, for the purpose of labor saving, a container loader that automates at least a part of the loading operation has been put into practical use. One example of a technique related to the automation of the loading operation is disclosed in Patent Literature 1.

A second embodiment of Patent Literature 1 describes a configuration including a storage shed for storing a reel (one example of the component container), a storage shed for storing a feeder (one example of the component supply unit), a reel set device (one example of the container loader), a conveyance device, and a management section. The reel set device performs the loading operation for setting a reel to a feeder. The conveyance device conveys the set-up feeder to the component mounter. The management section controls the delivery, the loading operation, the conveyance operation, or the like of the reels and the feeders, and manages the production of the component mounter. According to this configuration, it is said that the combination and the location of the reel and the feeder can be easily recognized so that the real and the feeder can be easily managed.

PATENT LITERATURE

Patent Literature 1: International Publication No. 2019/142336

BRIEF SUMMARY

Technical Problem

Incidentally, in the reel set device of Patent Literature 1, it is preferable that the loading operation itself is automated to achieve labor saving. However, the operation of conveying the reel and the feeder from the storage shed to the reel set device or the operation of loading the set-up feeder on the conveyance device is manually performed. In other words, the related operations before and after the loading operation still require human hands.

An object of the present specification is to provide a component supply unit set-up system that achieves labor saving in related operations before and after a loading operation for loading a component supply unit with a component container.

Solution to Problem

The present specification discloses a component supply unit set-up system including a container warehouse configured to store multiple component containers for containing multiple components, a unit storage shed configured to store multiple component supply units used when the components, which are contained in the component containers, are supplied in a mounting operation performed by a component mounter, an operation table disposed between the container warehouse and the unit storage shed and used for a loading operation to load the component supply unit with the component container, a container conveyance robot configured to convey the component container between the container warehouse and the operation table, and a unit conveyance robot configured to convey the component supply unit between the unit storage shed and the operation table.

Advantageous Effects

In a component supply unit set-up system of the present specification, a component container is conveyed from a container warehouse to an operation table by a container conveyance robot, and a component supply unit is conveyed from a unit storage shed to the operation table by a unit conveyance robot. Further, the component supply unit, which is loaded with the component container on the operation table in a loading operation is returned to the unit storage shed by the unit conveyance robot. Therefore, labor saving of related operations such as conveyance performed before and after the loading operation is achieved regardless of whether the loading operation is automated.

DESCRIPTION OF EMBODIMENTS

1. Configuration of Component Supply Unit Set-Up System 1 of First Embodiment A configuration of component supply unit set-up system 1 of a first embodiment will be described with reference to the configuration views of FIGS. 1 and 2, and the functional block diagram of FIG. 3. Set-up system 1 corresponds to a loading operation for loading component supply unit 92 with component container 91 and the related operations before and after the loading operation. Set-up system 1 includes container warehouse 2, unit storage shed 3, operation table 4, container conveyance robot 5, unit conveyance robot 6, set-up control section 8, and the like.

Component container 91 contains multiple components. Component supply unit 92 is used when supplying the components contained in component container 91 in a mounting operation performed by component mounter 98. Identification codes indicating each type or individual are attached to component container 91 and component supply unit 92. The identification code of component container 91 includes information indicating the type of the component contained in component container 91. As the identification code, a barcode, a two-dimensional code, or the like is used.

As component container 91, a tape reel can be exemplified, and as component supply unit 92, an integral type feeder device in which the tape reel is directly loaded can be exemplified. A carrier tape in which multiple components are sealed at a predetermined pitch is wound and held on the tape reel. The feeder device is installed on component mounter 98 in a form in which the tape reel is loaded. The feeder device supplies the component to a component mounting tool of component mounter 98 by pulling out the carrier tape from the tape reel and sending the carrier tape to a component pick up position. When the mounting operation of the component proceeds and the component of the tape reel is consumed, the entire feeder device is exchanged.

The feeder device is not limited to an integral type and may be a separate type. The separate type feeder device is configured to include a feeder main body portion having a feeding mechanism of the carrier tape and a reel cassette in which the tape reel is loaded. The feeder main body portion is permanently provided in component mounter 98, and the separate reel cassette is disposed in the vicinity of the feeder main body portion. When the mounting operation of the component proceeds and the component of the tape reel is consumed, the reel cassette is exchanged. The reel cassette corresponds to component supply unit 92 in which component container 91 is loaded.

Hereinafter, a case where component supply unit 92 is an integral type feeder device and component container 91 is a tape reel will be described. A tray may be used as component container 91, and a tray loading unit may be used as component supply unit 92.

Figure 1:
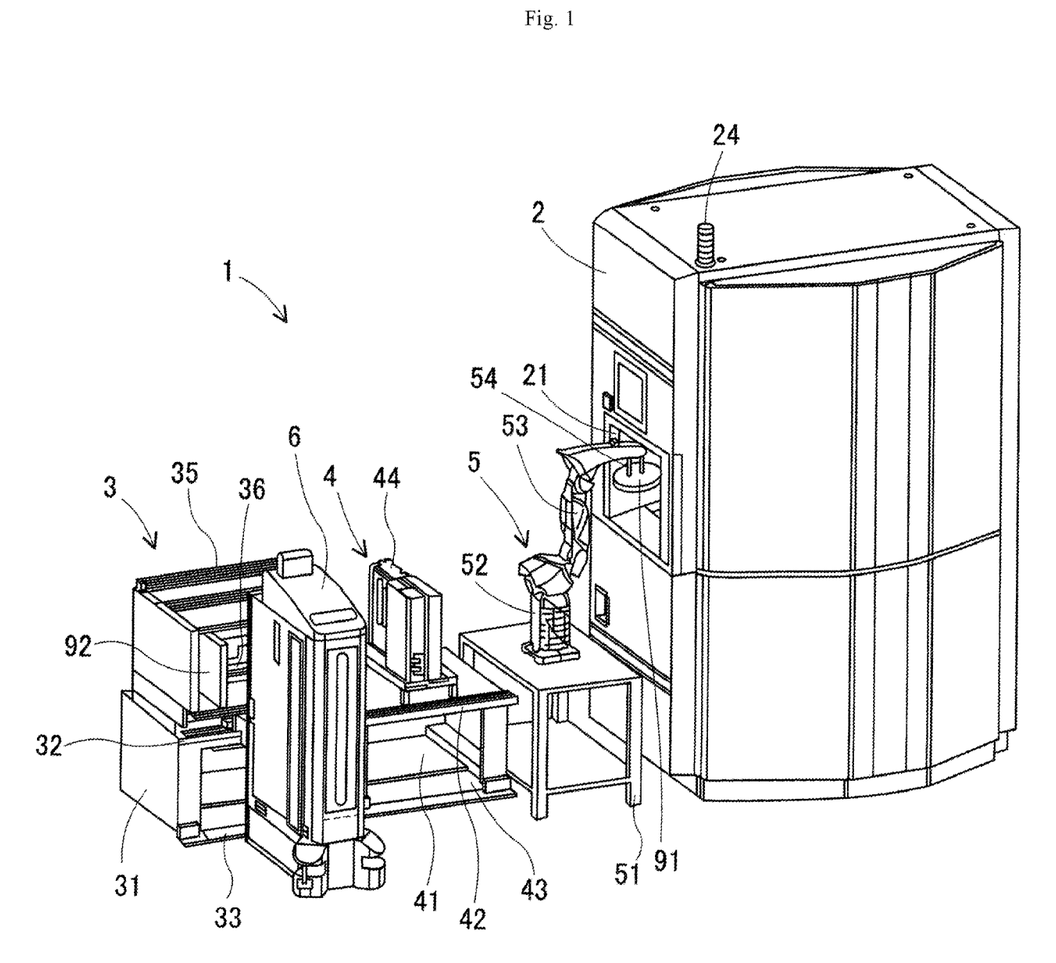
FIG. 1 is a perspective view schematically illustrating a configuration of a component supply unit set-up system of a first embodiment.
Figure 2:
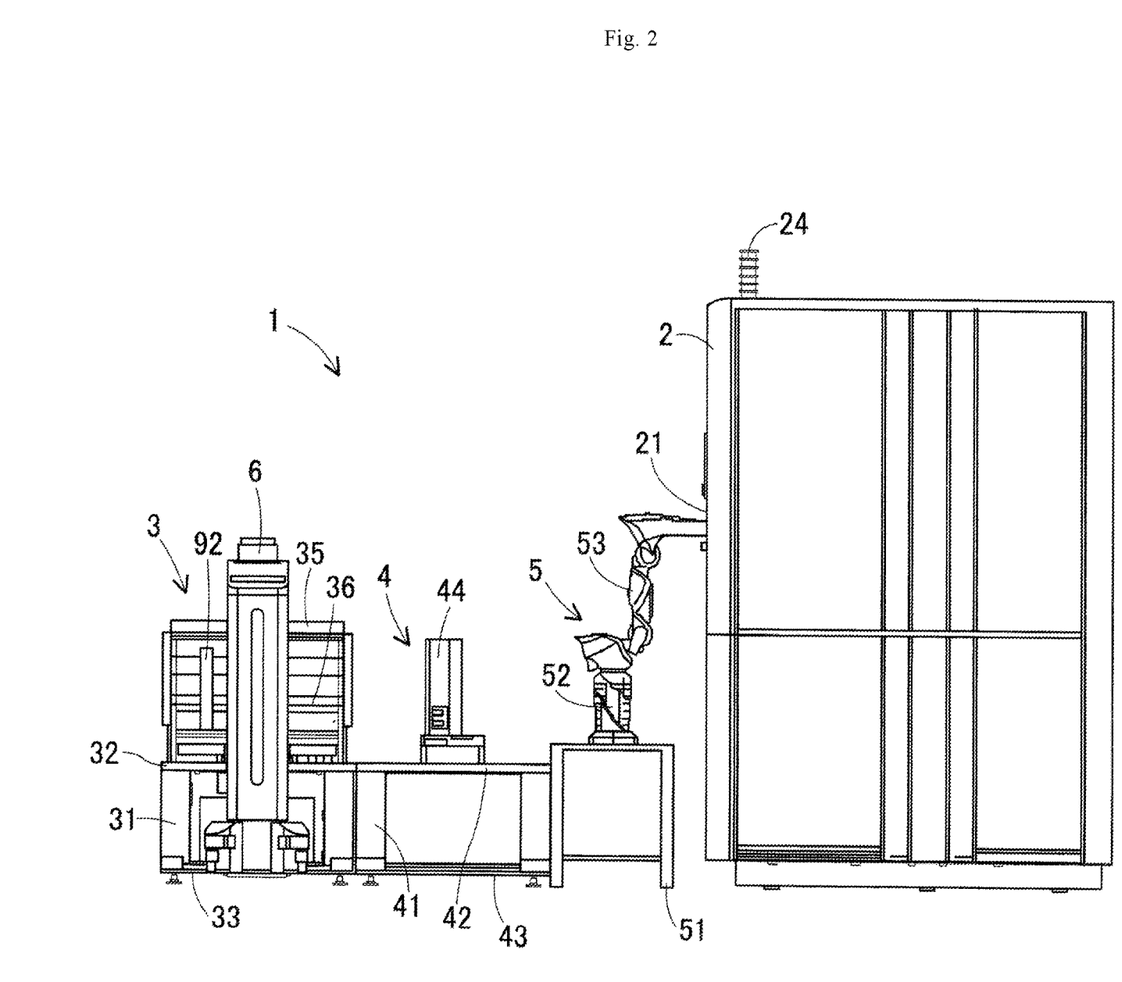
FIG. 2 is a front view schematically illustrating a configuration of the component supply unit set-up system of the first embodiment.
Figure 3:
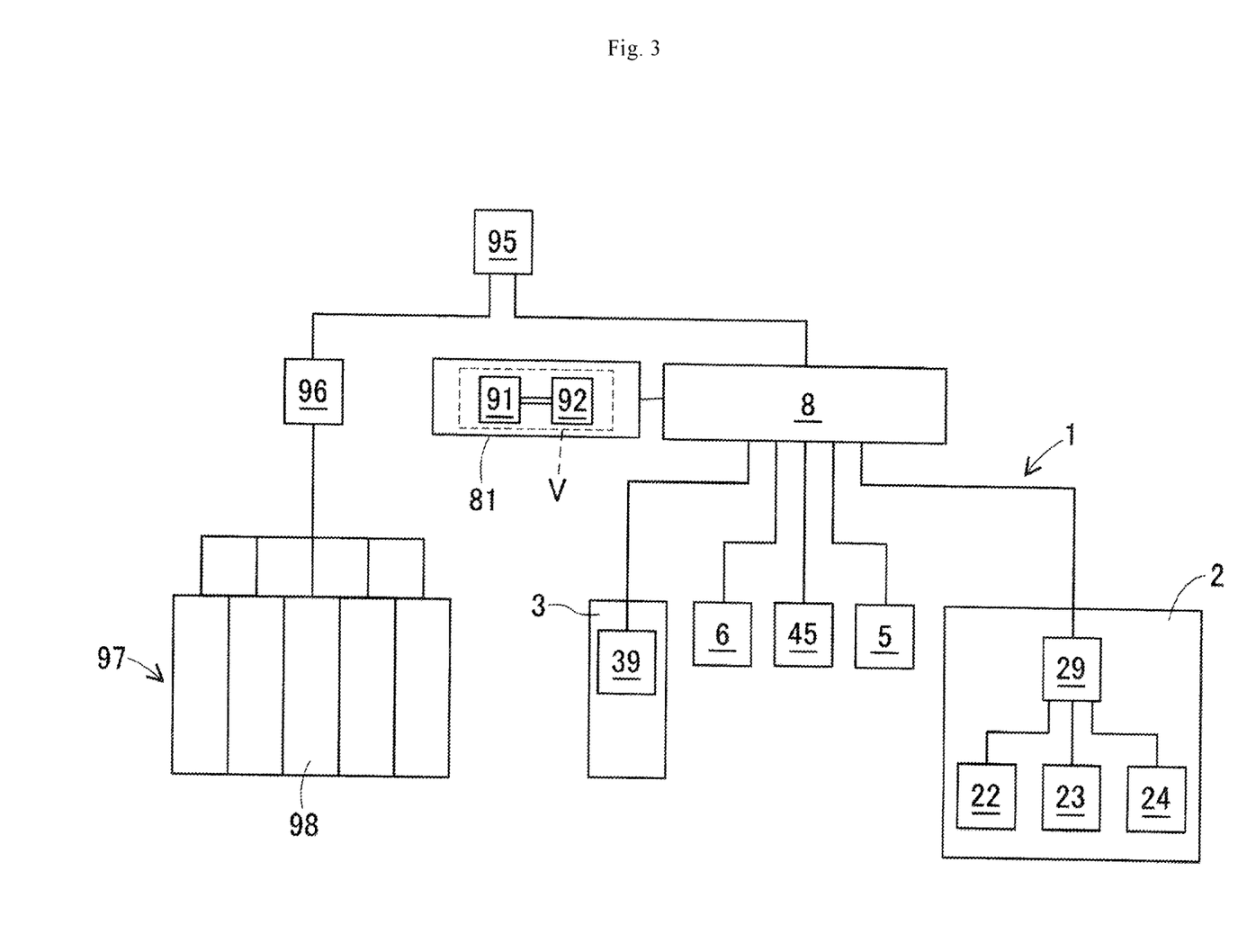
FIG. 3 is a functional block diagram illustrating a configuration of control in the first embodiment.

Container warehouse 2 stores multiple component containers 91. As illustrated in FIGS. 1 and 2, container warehouse 2 is formed in a large vertical substantially octagonal prism shape. Container warehouse 2 has a storage port on the rear side and retrieval port 21 at a substantially mid-height of the left side face. As illustrated in FIG. 3, multiple storing positions, actuator 22, and code reader 23 are provided in container warehouse 2. Actuator 22 transfers component container 91 stored in the storage port to the storing position and transfers component container 91 in the storing position to retrieval port 21. Actuator 22 is controlled by warehouse control section 29.

Code reader 23 reads the identification code attached to stored component container 91 and delivers the read result to warehouse control section 29. Therefore, warehouse control section 29 can recognize the individuals of all stored component containers 91 in association with the storing positions. As illustrated in FIGS. 1 and 2, warning lamp 24 is provided on the left front side of the upper portion of container warehouse 2. Warehouse control section 29 controls the lighting of warning lamp 24 when an abnormality occurs or a failure occurs and notifies an operator of the same.

Unit storage shed 3 stores multiple component supply units 92. Unit storage shed 3 includes base 31 and storage rack 35. Base 31 is formed in a rectangular parallelepiped frame shape. Upper section guide 32 extending in the left-right direction is provided on an upper portion of the front face of base 31. Lower section guide 33 extending in the left-right direction is provided on a lower portion of the front face of base 31. Upper section guide 32 and lower section guide 33 are formed in, for example, a protrusion shape protruding ahead or a groove shape opened upward.

Storage rack 35 is formed in a box shape opening on the front side and is fixed to an upper portion of base 31. Multiple storage slots arranged in the left-right direction are formed on a bottom face of the inner side of storage rack 35. Storage slot is formed with, for example, a groove extending in the front-rear direction, into which component supply unit 92 is inserted from the front side and stored. Component supply unit 92 stored in unit storage shed 3 does not matter whether component container 91 is loaded. In FIGS. 1 and 2, one component supply unit 92 is illustrated, and in actuality, multiple component supply units 92 are stored side by side in the left-right direction.

Multiple storing side connectors 36, which are arranged in the left-right direction corresponding to the storage slots, are provided on a rear face of the inner side of storage rack 35. When component supply unit 92 is stored in the storage slot, the unit side connector provided on the rear side of component supply unit 92 is automatically fitted into storing side connector 36. As a result of this fitting, component supply unit 92 is supplied with power and is communicatively connected to storage shed control section 39 (see FIG. 3). Component supply unit 92 stores the information on its own identification code in a built-in memory. Therefore, storage shed control section 39 can acquire the identification codes of all stored component supply units 92 by the communication and recognize the identification code in association with the position of the storage slot.

Unit storage shed 3 is capable of being additionally installed. When additional unit storage shed 3 is installed, multiple unit storage sheds 3 are disposed adjacent to each other in the left-right direction. As a result, multiple upper section guides 32 are connected in the left-right direction to form a long movement guide. Similarly, multiple lower section guides 33 are connected in the left-right direction to form a long movement guide.

Operation table 4 is disposed between container warehouse 2 and unit storage shed 3. Operation table 4 is used for the loading operation to load component supply unit 92 with component container 91. Operation table 4 includes base 41 and operation jig 44. Base 41 is formed in a rectangular parallelepiped frame shape having a height equivalent to that of base 31 of unit storage shed 3. Upper section guide 42 extending in the left-right direction is provided on an upper portion of the front face of base 41. Lower section guide 43 extending in the left-right direction is provided on a lower portion of the front face of base 41.

Upper section guide 42 and lower section guide 43 are disposed at the same height as upper section guide 32 and lower section guide 33 of unit storage shed 3 and are formed in the same shape. Upper section guide 42 and upper section guide 32 are connected side by side in the left-right direction to form a long movement guide. Similarly, lower section guide 43 and lower section guide 33 are connected side by side in the left-right direction to form a long movement guide.

Operation jig 44 is attached to an upper portion of base 41 in an attachable and detachable manner. Operation jig 44 has the function of holding component supply unit 92 and facilitates the loading operation (set-up operation) of component container 91 by the operator. Examples of the loading operation include an operation of assembling the tape reel corresponding to component container 91 with respect to the feeder device corresponding to component supply unit 92, an operation of pulling out the carrier tape from the tape reel to cut an unnecessary portion of a distal end, and an operation of advancing the distal end of the carrier tape after cutting to a predetermined position in the feeder device.

Further, code reader 45 is included in operation jig 44 (see FIG. 3). Code reader 45 reads the identification code attached to component container 91 or component supply unit 92. As a result, load information V (see FIG. 3) associating an individual of component container 91 with an individual of component supply unit 92, which is loaded with component container 91, is created. The creation of load information V can be viewed as part of the loading operation. Operation jig 44 can also be used for a removing operation for removing component container 91 from component supply unit 92.

Container conveyance robot 5 conveys component container 91 between container warehouse 2 and operation table 4. Container conveyance robot 5 is an arm robot in an embodiment of a non-moving robot that does not require movement. Container conveyance robot 5 includes leg portion 51, main body portion 52, and arm portion 53. Leg portion 51 is provided between container warehouse 2 and operation table 4 disposed close to each other. Leg portion 51 is formed in a table shape having a rectangular upper face.

Main body portion 52 is fixed to the center of the upper face of leg portion 51. Arm portion 53 is provided on an upper portion of main body portion 52. Arm portion 53 is configured to be articulated so as to be able to freely operate. End effector 54 suitable for component container 91 is provided at a distal end of arm portion 53. Examples of end effector 54 include a suction cup that picks up component container 91 with negative pressure, fingers that clamp component container 91, or the like. Container conveyance robot 5 receives component container 91 at retrieval port 21 of container warehouse 2, conveys component container 91 to the vicinity of operation jig 44, and delivers component container 91 to the operator. Container conveyance robot 5 is controlled by set-up control section 8.

Container conveyance robot 5 may have a conveyance function in the opposite direction. Further, container conveyance robot 5 may be a conveyor robot in another embodiment of a non-moving robot. The conveyor robot rotationally rotates an annular conveyance conveyor and conveys component container 91 mounted on the conveyance conveyor from retrieval port 21 to the vicinity of operation jig 44.

Unit conveyance robot 6 conveys component supply unit 92 between unit storage shed 3 and operation table 4. Unit conveyance robot 6 is formed so as to be longitudinally long. Unit conveyance robot 6 includes a guide member and a movement drive section on the rear side. The guide member engages with the movement guide including multiple section guides (32, 33, 42, 43). As a result, the entire weight of unit conveyance robot 6 is supported by the movement guide, and the movement direction is predefined. The movement drive section operates, for example, by using a non-contact power supply device or a battery (not illustrated) as a power source. The movement drive section is configured to include, for example, a combination of traveling wheels and a drive motor, or a movement mechanism to which a linear motor is applied. As a result, unit conveyance robot 6 is moved the front side of unit storage shed 3 and operation table 4 along the movement guide.

Unit conveyance robot 6 further includes a unit holding space and a unit operating mechanism. The unit holding space is a space defined in the inner portion of unit conveyance robot 6. The unit holding space temporarily holds component supply unit 92 to be conveyed. The unit operating mechanism receives and delivers component supply unit 92 between the unit holding space and storage rack 35, and between the unit holding space and operation jig 44. At the time, since the height of unit conveyance robot 6 is appropriately maintained by the engagement of the guide member and the movement guide, the reception and delivery operation is stabilized. Unit conveyance robot 6 is controlled by set-up control section 8.

2. Configuration Related to Control of Set-Up System 1

Next, a configuration related to control of set-up system 1 will be described. As illustrated in FIG. 3, set-up control section 8 is communicatively connected to production management device 95. Production management device 95 is communicatively connected to line control section 96. Further, line control section 96 is communicatively connected to each of multiple types of board work machines constituting board work line 97. Board work line 97 is a production line for mounting components on a board to mass-produce a board product. Component mounter 98 constituting board work line 97 is installed with set-up component supply unit 92 to enable the supply of the components.

Production management device 95 manages a production plan and a production progress status of the board product. Line control section 96 controls the operation of board work line 97 based on the production plan received from production management device 95. Further, line control section 96 sequentially transmits the production progress status in board work line 97 to production management device 95.

On the other hand, set-up control section 8 is communicatively connected to warehouse control section 29 of container warehouse 2 and storage shed control section 39 of unit storage shed 3. Further, set-up control section 8 is connected to code reader 45 and generates load information V from the read result. Further, set-up control section 8 controls container conveyance robot 5 and unit conveyance robot 6. Further, load information memory section 81 included in set-up control section 8 stores load information V. Set-up control section 8 includes a man-machine interface (an input section, a display section, a wireless communication section, or the like) for exchanging information with the operator.

Various information including load information V is appropriately transmitted and received between the control elements described above. Further, all of each control element described above needs not to be independent hardware.

For example, set-up control section 8, warehouse control section 29, and storage shed control section 39 may be achieved by different software of one computer device. Further, for example, set-up control section 8 may be achieved as a partial function of production management device 95. Further, the communication connection or the information transmission described above may be performed by using a wireless communication device. The control functions of set-up control section 8 and the like will be described in detail in the following description of operations.

3. Operation of Set-Up System 1

Next, the operation of set-up system 1 will be described with reference to FIG. 4. In step S1 in FIG. 4, set-up control section 8 determines whether a component replenishment timing due to a component shortage is close with reference to the production progress status of the board product managed by production management device 95. For example, it is determined whether the remaining number of components of component container 91 of component supply unit 92 installed on component mounter 98 is decreased to a predefined number or less. When the component replenishment timing is close, set-up control section 8 determines that right now is the timing of performing the loading operation and executes steps S2 to S5. When the component replenishment timing is not close, set-up control section 8 immediately advances the control to step S11. It is needless to say that the timing of performing the loading operation is determined with a margin exceeding the required time of the loading operation with respect to the component shortage prediction time.

In step S2, set-up control section 8 notifies the operator that the loading operation is necessary. In the next step S3, set-up control section 8 selects component container 91 of a component type requiring replenishment. Further, set-up control section 8 designates the identification code of component container 91, commands warehouse control section 29 to perform retrieval, and commands container conveyance robot 5 to perform conveyance. Warehouse control section 29 controls actuator 22 in accordance with the command and sends component container 91 to retrieval port 21. Container conveyance robot 5 conveys component container 91 at retrieval port 21 to the vicinity of operation jig 44 in accordance with the command.

In the next step S4, set-up control section 8 selects component supply unit 92 that can be loaded with component container 91. Further, set-up control section 8 designates the identification code of component supply unit 92 and commands unit conveyance robot 6 to convey component supply unit 92. Unit conveyance robot 6 picks up component supply unit 92 from unit storage shed 3 and conveys the same in accordance with the command, and causes operation jig 44 to hold the same. Steps S2, S3, and S4 may be executed in parallel, or the execution procedure may be exchanged.

In the next step S5, the operator who receives the notification moves component feed unit 92 to operation table 4 to perform the loading operation. Specifically, first, the operator receives component container 91 from container conveyance robot 5. Secondly, the operator causes the code reader 45 to read the identification codes of component container 91 and component supply unit 92. As a result, set-up control section 8 creates load information V. Created load information V is shared by unit storage shed 3 and component mounter 98 by the communication or the like.

Third, the operator loads component supply unit 92 with component container 91. The operator transports set-up component supply unit 92, which is loaded with component container 91, to component mounter 98 or instructs set-up control section 8 to temporarily store the same. Set-up control section 8 that has received the instruction causes unit conveyance robot 6 to convey and store set-up component supply unit 92 from operation jig 44 to unit storage shed 3. After the end of step S5, set-up control section 8 advances the control to step S11.

In step S11, set-up control section 8 determines whether the timing of performing set-up change for changing the type of the board product is close by referring to the production plan and the production progress status of the board product. For example, it is determined whether the remaining number of produced board products of the currently produced type is decreased to a predefined number or less. When the timing of performing the set-up change is close, set-up control section 8 determines that right now is the timing of performing the loading operation and executes steps S12 to S15. When the timing of performing the set-up change is not close, set-up control section 8 immediately returns the control to step S1. It is needless to say that the timing of performing the loading operation is determined with a margin exceeding the required time for necessary multiple loading operations with respect to the estimated production completion time of the current board product.

Since the operations of steps S12 to S15 are the same as the operations of steps S2 to S5, descriptions thereof will be omitted. In the set-up change, it is generally necessary to perform multiple loading operations to prepare for multiple component supply units 92. Therefore, in step S16, set-up control section 8 determines whether all component supply units 92 required for the set-up change are prepared. While all component feed units 92 are not prepared, set-up control section 8 and the operator repetitively executes steps S13 to S15. When all component supply units 92 are prepared by the repetition, set-up control section 8 returns the control to step S1.

In component supply unit set-up system 1 of the first embodiment, component container 91 is conveyed from container warehouse 2 to operation table 4 by container conveyance robot 5, and component supply unit 92 is conveyed from unit storage shed 3 to operation table 4 by unit conveyance robot 6. Further, component supply unit 92, which is loaded with component container 91, on operation table 4 is returned to unit storage shed 3 by unit conveyance robot 6. Therefore, labor saving of related operations such as conveyance performed before and after the loading operation is achieved regardless of whether the loading operation is automated.

Further, set-up control section 8 can timely determine the timing of performing the loading operation based on the production plan and the production progress status of the board product. According to this configuration, since component supply unit 92, in which the loading operation was ended and the set-up was already performed, does not increase unnecessarily, the labor for management is reduced. Further, component supply unit 92 does not become a work-in-process product that cannot be diverted to other uses, so that efficient operation is enabled. Further, it is possible to reduce stagnation for the mounting operation of component mounter 98 due to the delay of the loading operation. Further, by disposing the devices related to the loading operation adjacent to each other, a space-saving system configuration is achieved.

4. Component Supply Unit Set-Up System 1A of Second Embodiment

Figure 5:
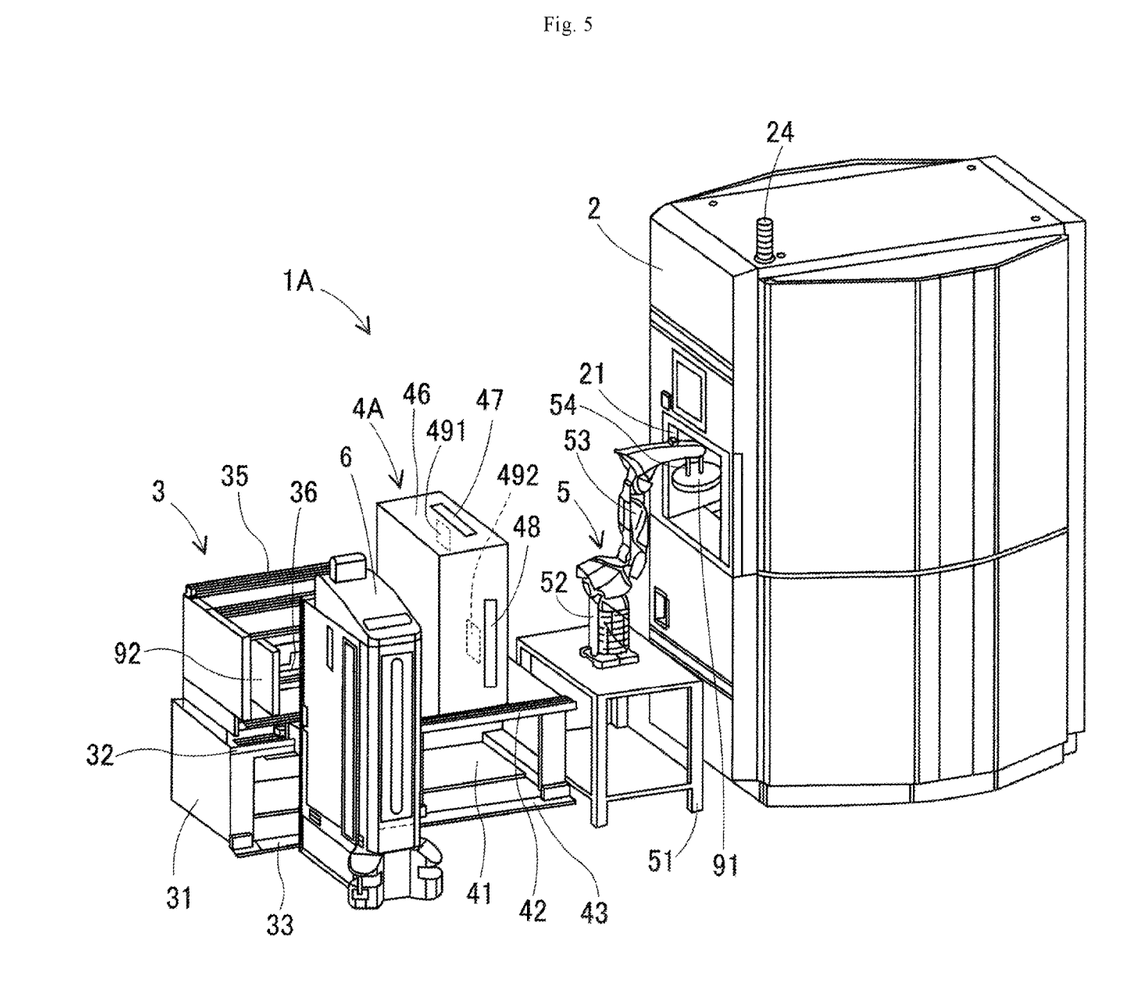
FIG. 5 is a perspective view schematically illustrating a component supply unit set-up system of a second embodiment.

Next, set-up system 1A of a second embodiment will be described with reference to FIG. 5 mainly on points different from the first embodiment. As illustrated in FIG. 5, operation table 4A of the second embodiment includes container loader 46. Container loader 46 automatically performs the loading operation performed by the operator in the first embodiment. The other configurations of the second embodiment are the same as those of the first embodiment.

Container loader 46 is attached to an upper portion of base 41 in place of operation jig 44. Container loader 46 is formed in a box shape larger than operation jig 44. Container insertion port 47 through which component container 91 is inserted is provided on the upper face of container loader 46. Unit insertion port 48 through which component supply unit 92 is inserted is provided on the front face of container loader 46. First code reader 491 for reading the identification code of component container 91 and second code reader 492 for reading the identification code of component supply unit 92 are provided in container loader 46.

Container conveyance robot 5 inserts component container 91 conveyed from container warehouse 2 into container insertion port 47. Further, unit conveyance robot 6 inserts component supply unit 92 conveyed from unit storage shed 3 into unit insertion port 48. When component container 91 and component supply unit 92 are inserted, first code reader 491 and second code reader 492 are operated, respectively. As a result, load information V is generated in container loader 46.

Thereafter, container loader 46 automatically performs the loading operation. When the loading operation is normally ended, load information V is transmitted to set-up control section 8. Component supply unit 92 that is loaded with component container 91 is conveyed to unit storage shed 3 by unit conveyance robot 6. According to the second embodiment, automation of the loading operation and the related operations such as conveyance performed before and after the loading operation is achieved.

5. Component Supply Unit Set-Up System 1B of Third Embodiment

Next, set-up system 1B of a third embodiment will be described with reference to FIGS. 6 and 7 mainly on points different from the first and second embodiments. In the third embodiment, landing station 61, unit storage 64, traveling path 65, and conveyance vehicle 66 are added to the configuration of the first embodiment.

Figure 6:
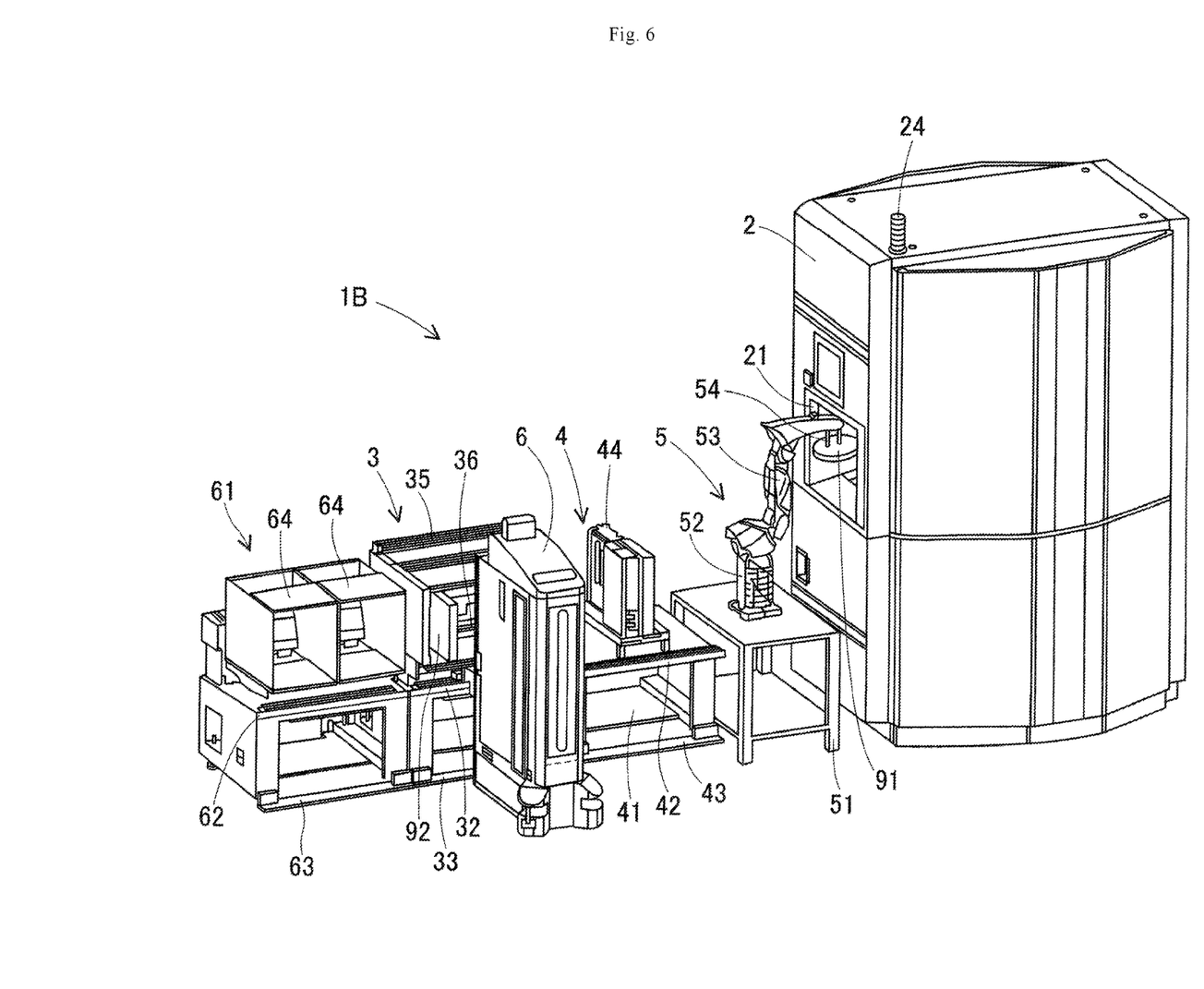
FIG. 6 is a perspective view schematically illustrating a part of a component supply unit set-up system of a third embodiment.

As illustrated in FIG. 6, landing station 61 is disposed side by side on the left of unit storage shed 3. Landing station 61 also serves as a carry-out station for carrying out component supply unit 92 in which component container 91 is loaded toward the component mounter 98 and a carry-in station for carrying in component supply unit 92 that has been used in the component mounter 98. At landing station 61, the loading and unloading of conveyance vehicle 66 to be started and arrival are performed, and further, the set-up on unit storage 64 is performed. Landing station 61 is formed in a rectangular parallelepiped frame shape.

Upper section guide 62 extending in the left-right direction is provided on an upper portion of the front face of landing station 61. Lower section guide 63 extending in the left-right direction is provided below the front face of landing station 61. Upper section guide 62 and lower section guide 63 are connected to upper section guide 32 and lower section guide 33 of unit storage shed 3 side by side to form a long movement guide. Therefore, unit conveyance robot 6 can move to the front side of landing station 61.

Two unit storages 64 are mounted on the upper face of landing station 61. Unit storage 64 stores multiple component supply units 92. Unit storage 64 is installed on component mounter 98 in a state in which multiple component supply units 92 are stored, so as to enable the supply of components. Unit storage 64 need not be installed in component mounter 98 but may improve the efficiency of the set-up work, the transportation, or the like of multiple component supply units 92.

Figure 7:
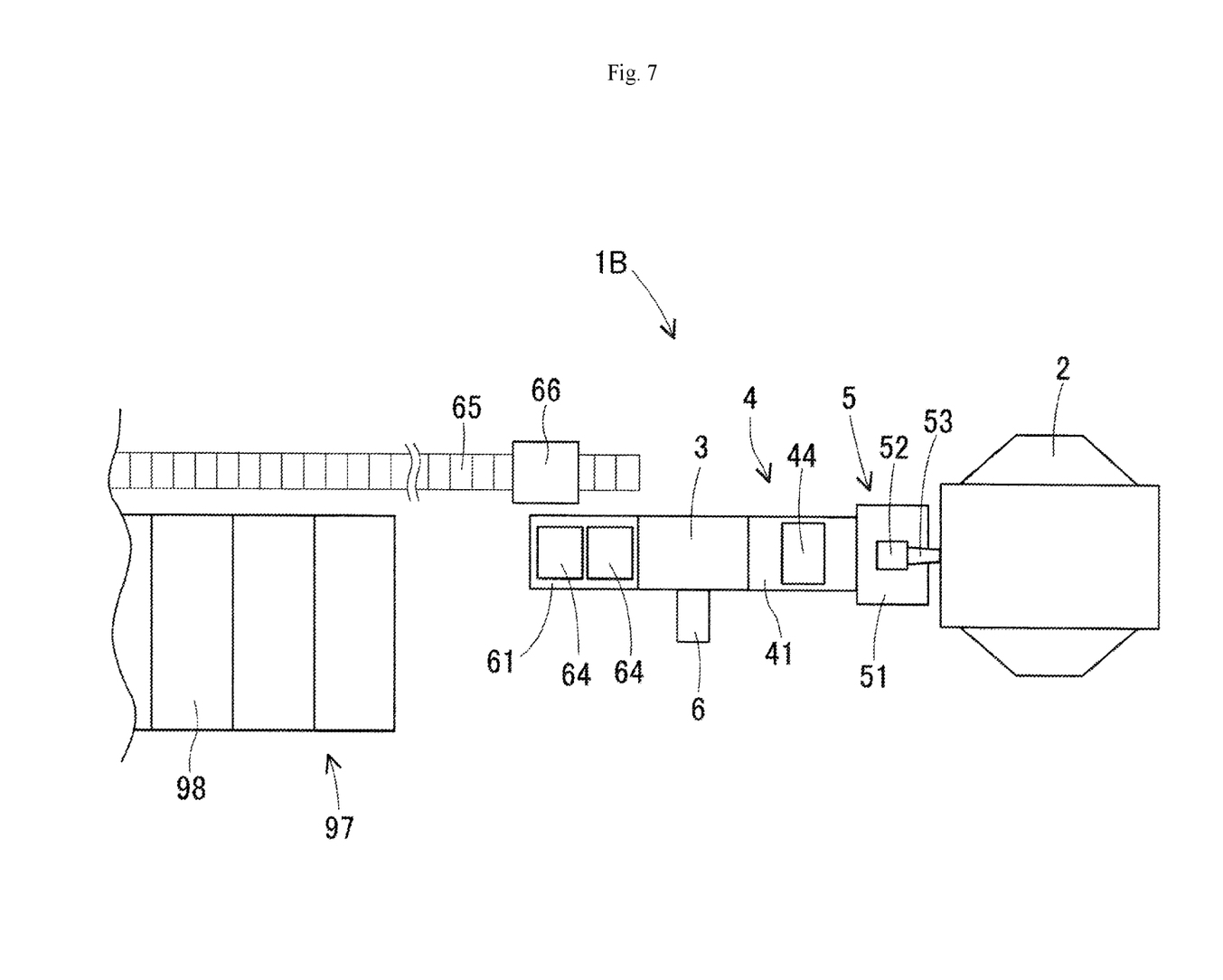
FIG. 7 is a plan view schematically illustrating the component supply unit set-up system of the third embodiment.

As illustrated in FIG. 7, traveling path 65 is laid from the rear side of landing station 61 to board work line 97. Conveyance vehicle 66 travels on traveling path 65 in accordance with a wireless command from set-up control section 8 and also loads and unloads unit storage 64. Conveyance vehicle 66 appropriately reports a progress status of the conveyance operation to set-up control section 8. The standby position of conveyance vehicle 66 is set on the rear side of landing station 61. Traveling path 65 may be laid over multiple board work lines 97 so that multiple conveyance vehicles 66 may travel while avoiding collisions. Further, conveyance vehicle 66 may be an AGV of a type in which physical traveling path 65 is unnecessary and travels by referring to information about the traveling path on map data.

In the above configuration, the operator performs the loading operation on operation table 4 as described in the first embodiment. Next, unit conveyance robot 6 conveys component supply unit 92, which is loaded with component container 91, from operation table 4 to landing station 61 and stores component supply unit 92 in unit storage 64. The operation of the operator and the operation of unit conveyance robot 6 described above are repeated so that unit storage 64 is ready to be used.

Thereafter, conveyance vehicle 66 removes unit storage 64 ready to be used from landing station 61 and loads the same. Next, conveyance vehicle 66 travels to component mounter 98, conveys unit storage 64, and installs unit storage 64 in component mounter 98. Alternatively, conveyance vehicle 66 delivers unit storage 64 to the operator in the vicinity of component mounter 98. According to the third embodiment, in addition to the related operations before and after the loading operation, automation of the operation of storing multiple component supply units 92 in unit storage 64 and the operation of transporting unit storage 64 to component mounter 98 is achieved.

6. Application and Modification of Embodiment

Figure 4:
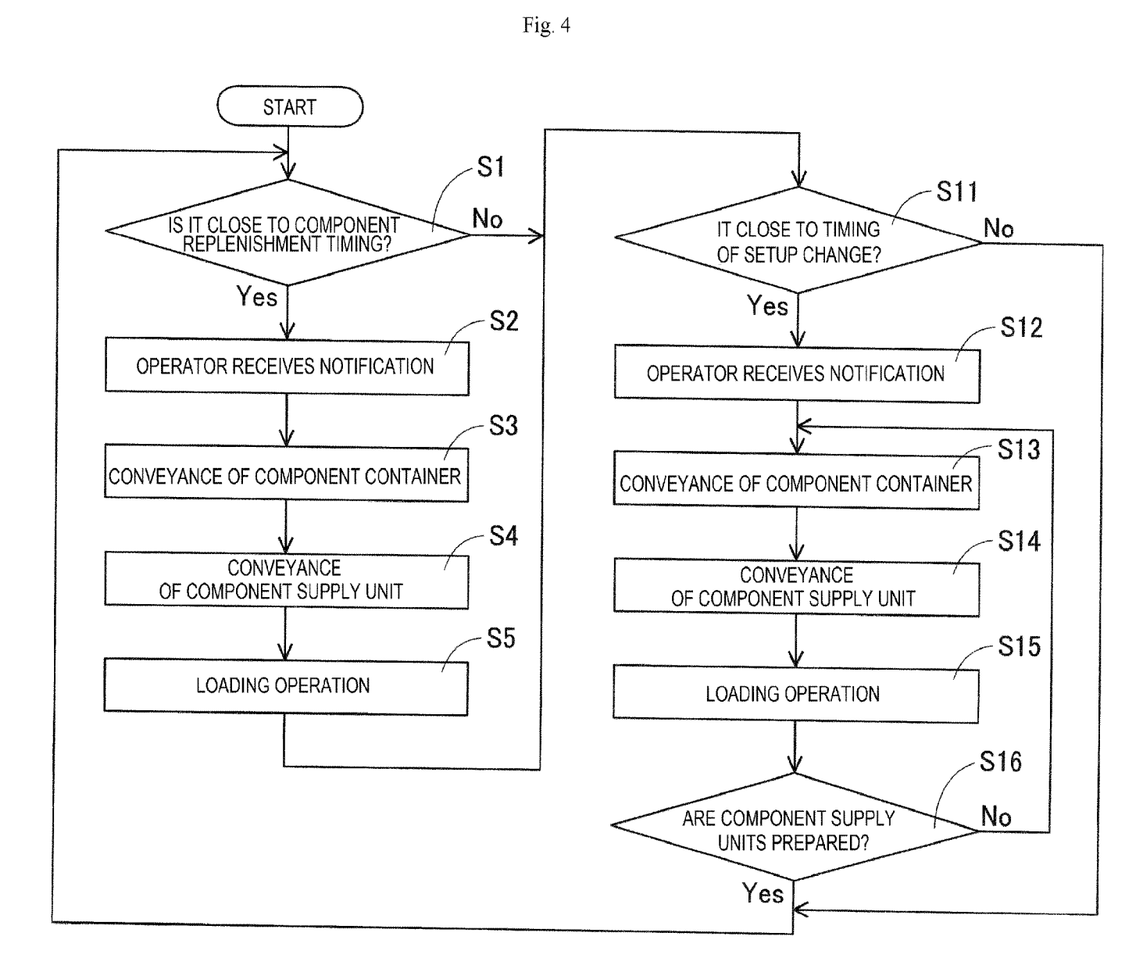
FIG. 4 is a diagram illustrating an operation flow for describing a control operation of a set-up control section in the first embodiment.

The determination of the component replenishment timing and the timing of performing the set-up change described in the operation flow of FIG. 4 may be performed by production management device 95. In this case, set-up control section 8 advances the control according to the command of performing the loading operation from production management device 95. Further, multiple unit storage sheds 3 may be provided to separately store component supply unit 92, which is loaded with component container 91, and component supply unit 92, which is not loaded with component container 91. Further, in configurations in which component mounter 98 are disposed close to set-up systems (1, 1A), unit conveyance robot 6 may convey component supply unit 92, which is loaded with component container 91, to component mounter 98.

Further, in the third embodiment, container loader 46 of the second embodiment may be applied in place of operation jig 44. In the third embodiment, conveyance vehicle 66 may return unit storage 64 that has been used in component mounter 98 to landing station 61. Thereafter, component container 91 is removed from component supply unit 92 on operation table 4. Component supply unit 92 is stored in unit storage shed 3, and component container 91 is returned and stored to and in container warehouse 2. Further, the first to third embodiments can be applied or modified in various manners.

REFERENCE SIGNS LIST 1, 1A, 1B: component supply unit set-up system
2: container warehouse
21: retrieval port
22: actuator
23: code reader
29: warehouse control section
3: unit storage shed
32: upper section guide
33: lower section guide
35: storage rack
39: storage shed control section
4, 4A: operation table
42: upper section guide
43: lower section guide
44: operation jig
45: code reader
46: container loader
5: container conveyance robot
53: arm portion
6: unit conveyance robot
61: landing station
62: upper section guide
63: lower section guide
64: unit storage
66: conveyance vehicle
8: set-up control section
81: load information memory section
91: component container
92: component supply unit
95: production management device
98: component mounter
V: load information

The invention claimed is:

1. A component supply unit set-up system comprising:
a container warehouse configured to store multiple component containers that contain multiple components;
a unit storage shed configured to store multiple component supply units that supply the components, which are contained in the component containers, in a mounting operation performed by a component mounter;
an operation table disposed between the container warehouse and the unit storage shed, the operation table including a container loader that automatically performs a loading operation to load the component supply unit with the component container;
a container conveyance robot configured to convey the component container between the container warehouse and the operation table; and
a unit conveyance robot configured to convey the component supply unit between the unit storage shed and the operation table,
wherein the container loader automatically loads the component supply unit conveyed by the unit conveyance robot with the component container conveyed by the container conveyance robot.

2. The component supply unit set-up system according to claim 1,
wherein the container conveyance robot is a non-moving robot that does not need to move between the container warehouse and the operation table disposed close to each other.

3. The component supply unit set-up system according to claim 1, further comprising:
a movement guide provided from the unit storage shed to the operation table,
wherein the unit conveyance robot is a moving robot that moves along the movement guide.

4. The component supply unit set-up system according to claim 3,
wherein the movement guide is configured such that section guides provided in each of the unit storage shed and the operation table are lined up in a movement direction of the unit conveyance robot.

5. The component supply unit set-up system according to claim 4,
wherein the unit storage shed is capable of being additionally installed.

6. The component supply unit set-up system according to claim 1,
wherein the component container is a tape reel in which a carrier tape containing the multiple components is wound, and
the component supply unit is a feeder device loaded with the tape reel or is a reel cassette loaded with the tape reel and formed separately from a feeder main body portion having a feeding mechanism of the carrier tape.

7. A component supply unit set-up system comprising:
a container warehouse configured to store multiple component containers for containing multiple components;
a unit storage shed configured to store multiple component supply units used when the components, which are contained in the component containers, are supplied in a mounting operation performed by a component mounter;
an operation table disposed between the container warehouse and the unit storage shed and used for a loading operation to load the component supply unit with the component container;
a container conveyance robot configured to convey the component container between the container warehouse and the operation table;
a unit conveyance robot configured to convey the component supply unit between the unit storage shed and the operation table; and
a set-up control section configured to control for selecting the component container to be conveyed from the container warehouse to the operation table, and determine a timing of performing the loading operation of the selected and conveyed component container on the operation table, based on a command from a production management device that manages at least one of a production plan and a production progress status of a board product on which the component is mounted or with reference to at least one of the production plan and the production progress status.

8. The component supply unit set-up system according to claim 7, further comprising:

a load information memory section configured to store load information in which an individual of the component containers and an individual of the component supply units, which are loaded with the component containers, are associated with each other.

* * * * *